US011864386B2

(12) United States Patent
Tang et al.

(10) Patent No.: US 11,864,386 B2
(45) Date of Patent: *Jan. 2, 2024

(54) MEMORY ARRAYS

(71) Applicant: Micron Technology, Inc., Boise, ID (US)

(72) Inventors: Sanh D. Tang, Kuna, ID (US); Richard J. Hill, Boise, ID (US); Yi Fang Lee, Boise, ID (US); Martin C. Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/837,879

(22) Filed: Jun. 10, 2022

(65) Prior Publication Data
US 2022/0320136 A1 Oct. 6, 2022

Related U.S. Application Data

(63) Continuation of application No. 17/028,734, filed on Sep. 22, 2020, now Pat. No. 11,404,440, which is a (Continued)

(51) Int. Cl.
H10B 43/27 (2023.01)
H10B 51/00 (2023.01)
(Continued)

(52) U.S. Cl.
CPC ........... *H10B 43/27* (2023.02); *G06F 3/0688* (2013.01); *H10B 51/00* (2023.02); *H10B 53/20* (2023.02)

(58) Field of Classification Search
CPC ........ H10B 43/27; H10B 51/00; H10B 53/20; H10B 12/036; H10B 12/33; H10B 53/10;
(Continued)

(56) References Cited

U.S. PATENT DOCUMENTS 3,387,286 A 6/1968 Dennard
5,977,580 A 11/1999 Yoon
(Continued)

FOREIGN PATENT DOCUMENTS

CN 1525549 9/2004
CN 101355085 1/2009
(Continued)

OTHER PUBLICATIONS

Matsubayashi et al., "20-nm-node trench-gate-self-aligned crystalline in—Ga—Zn-Oxide FET with high frequency and low off-state current", IEEE International Electron Devices Meeting (IEDM), Dec. 7-9, 2015, United States, 4 pages.

Primary Examiner — Victor A Mandala
(74) Attorney, Agent, or Firm — Wells St. John P.S.

(57) ABSTRACT

A memory array comprises vertically-alternating tiers of insulative material and memory cells. The memory cells individually comprise a transistor comprising first and second source/drain regions having a channel region therebetween and a gate operatively proximate the channel region. The individual memory cells comprise a capacitor comprising first and second electrodes having a capacitor insulator there-between. The first electrode electrically couples to the first source/drain region. Wordline structures extend elevationally through the insulative material and the memory cells of the vertically-alternating tiers. Individual of the gates that are in different of the memory cell tiers directly electrically couple to individual of the wordline structures. Sense-lines electrically couple to multiple of the second source/drain regions of individual of the transistors. Other embodiments are disclosed.

16 Claims, 13 Drawing Sheets

Related U.S. Application Data continuation of application No. 16/204,224, filed on Nov. 29, 2018, now Pat. No. 10,950,618.

(51) Int. Cl.
*H10B 53/20* (2023.01)
*G06F 3/06* (2006.01)

(58) Field of Classification Search
CPC ....... H10B 53/40; H10B 53/50; G06F 3/0688; H01L 27/11582; H01L 27/11514; H01L 27/11585
See application file for complete search history.

(56) References Cited

U.S. PATENT DOCUMENTS

| | | | |
|---|---|---|---|
| 6,191,569 B1 | 2/2001 | Arbetter et al. | |
| 7,663,188 B2 | 2/2010 | Chung | |
| 8,541,826 B2 | 9/2013 | Pan et al. | |
| 9,230,985 B1* | 1/2016 | Wu | H10B 43/27 |
| 9,263,577 B2 | 2/2016 | Ramaswamy et al. | |
| 9,698,272 B1 | 7/2017 | Ikeda et al. | |
| 10,950,618 B2* | 3/2021 | Tang | H10B 53/20 |
| 10,964,701 B2* | 3/2021 | Sharma | H01L 29/78642 |
| 11,404,440 B2* | 8/2022 | Tang | H10B 12/036 |
| 2004/0232466 A1 | 11/2004 | Birner et al. | |
| 2005/0157583 A1 | 7/2005 | Hofmann | |
| 2007/0158731 A1* | 7/2007 | Bae | H10B 53/00 |
| | | | 257/E21.663 |
| 2007/0161277 A1 | 7/2007 | Baars et al. | |
| 2007/0236979 A1* | 10/2007 | Takashima | H01L 28/55 |
| | | | 257/E21.664 |
| 2010/0038743 A1* | 2/2010 | Lee | H01L 21/2007 |
| | | | 257/E27.07 |
| 2011/0033955 A1 | 2/2011 | Kang | |
| 2011/0079836 A1 | 4/2011 | Lin | |
| 2012/0064704 A1 | 3/2012 | Kim | |
| 2012/0075917 A1 | 3/2012 | Takemura | |
| 2012/0147644 A1 | 6/2012 | Scheuerlein | |
| 2012/0228688 A1 | 9/2012 | Matsubayashi | |
| 2013/0037879 A1* | 2/2013 | Filippini | H10B 12/395 |
| | | | 257/330 |
| 2013/0069052 A1 | 3/2013 | Sandhu | |
| 2013/0070506 A1 | 3/2013 | Kajigaya | |
| 2013/0095580 A1 | 4/2013 | Or-Bach et al. | |
| 2013/0161607 A1 | 6/2013 | Yoneda et al. | |
| 2014/0035018 A1 | 2/2014 | Lee | |
| 2014/0210026 A1 | 7/2014 | Karlsson et al. | |
| 2015/0048292 A1 | 2/2015 | Park | |
| 2015/0340316 A1 | 11/2015 | Or-Bach et al. | |
| 2016/0049406 A1 | 2/2016 | Sandhu | |
| 2016/0322368 A1 | 11/2016 | Sun et al. | |
| 2017/0012126 A1 | 1/2017 | Chu-Kung et al. | |
| 2017/0018570 A1 | 1/2017 | Lue et al. | |
| 2017/0053906 A1 | 2/2017 | Or-Bach et al. | |
| 2017/0092371 A1* | 3/2017 | Harari | H01L 29/66833 |
| 2018/0197864 A1* | 7/2018 | Sills | H10B 12/20 |
| 2018/0323199 A1* | 11/2018 | Roberts | H10B 12/48 |
| 2018/0323200 A1* | 11/2018 | Tang | H01L 23/528 |
| 2019/0027493 A1* | 1/2019 | Kimura | H10B 41/35 |
| 2019/0067206 A1* | 2/2019 | Bedeschi | G11C 11/2253 |
| 2019/0067288 A1* | 2/2019 | Juengling | G11C 11/408 |
| 2019/0103406 A1* | 4/2019 | Tang | H01L 29/78618 |
| 2019/0164985 A1* | 5/2019 | Lee | H10B 12/05 |
| 2019/0198510 A1* | 6/2019 | Kim | H10B 43/10 |
| 2020/0105330 A1* | 4/2020 | Kimura | H01L 29/66969 |
| 2020/0111793 A1* | 4/2020 | Kim | H10B 12/30 |
| 2020/0411522 A1 | 12/2020 | Tang et al. | |
| 2022/0278121 A1* | 9/2022 | Lee | H10B 12/30 |

FOREIGN PATENT DOCUMENTS

| | | |
|---|---|---|
| CN | 102522407 | 6/2012 |
| CN | 104115226 | 10/2014 |
| CN | 106463510 | 2/2017 |
| CN | 201880025498.3 | 8/2022 |
| EP | 21156374 | 5/2021 |
| EP | 19888754 | 7/2022 |
| JP | H 03-205867 | 9/1991 |
| KR | 10-2012-0069258 | 6/2012 |
| WO | WO 2017/034647 | 3/2017 |
| WO | WO PCT/US2019/062262 | 3/2020 |
| WO | WO PCT/US2019/062262 | 5/2021 |

* cited by examiner

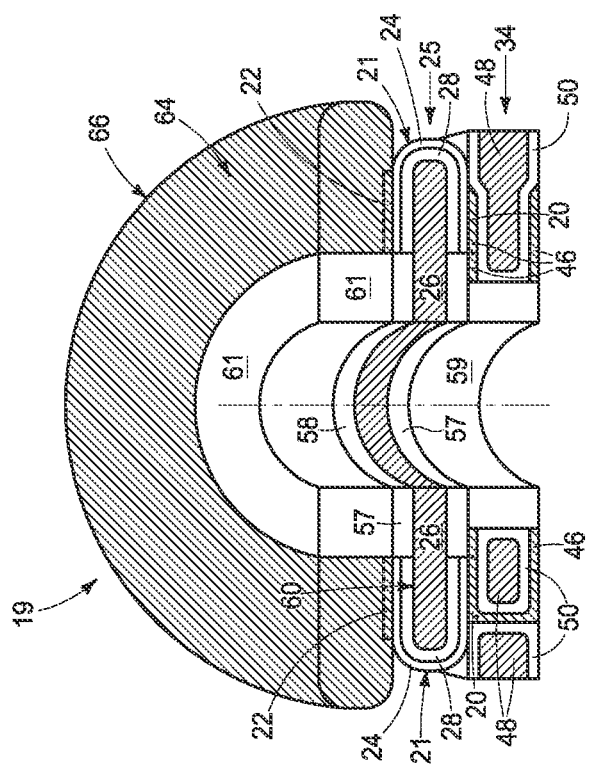
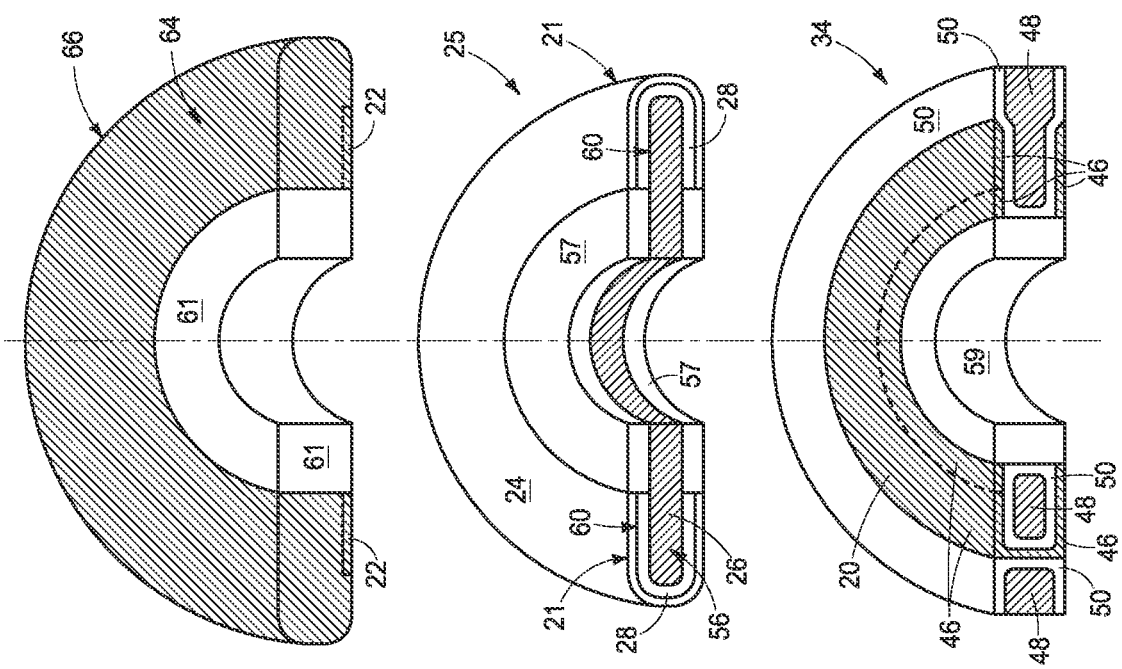
FIG. 7

MEMORY ARRAYS

RELATED PATENT DATA

This patent resulted from a continuation of U.S. patent application Ser. No. 17/028,734 filed Sep. 22, 2020, which is a continuation of U.S. patent application Ser. No. 16/204,224 filed Nov. 29, 2018, now U.S. Pat. No. 10,950,618, each of which is hereby incorporated by reference herein.

TECHNICAL FIELD

Embodiments disclosed herein pertain to memory arrays.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense-lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferro-electric.

BRIEF DESCRIPTION OF THE DRAWINGS

FIG. 7 is an enlarged side-by-side exploded perspective view and enlarged assembled perspective view of certain components of the FIG. 1 substrate fragment.

DETAILED DESCRIPTION OF EXAMPLE EMBODIMENTS

Figure 1:
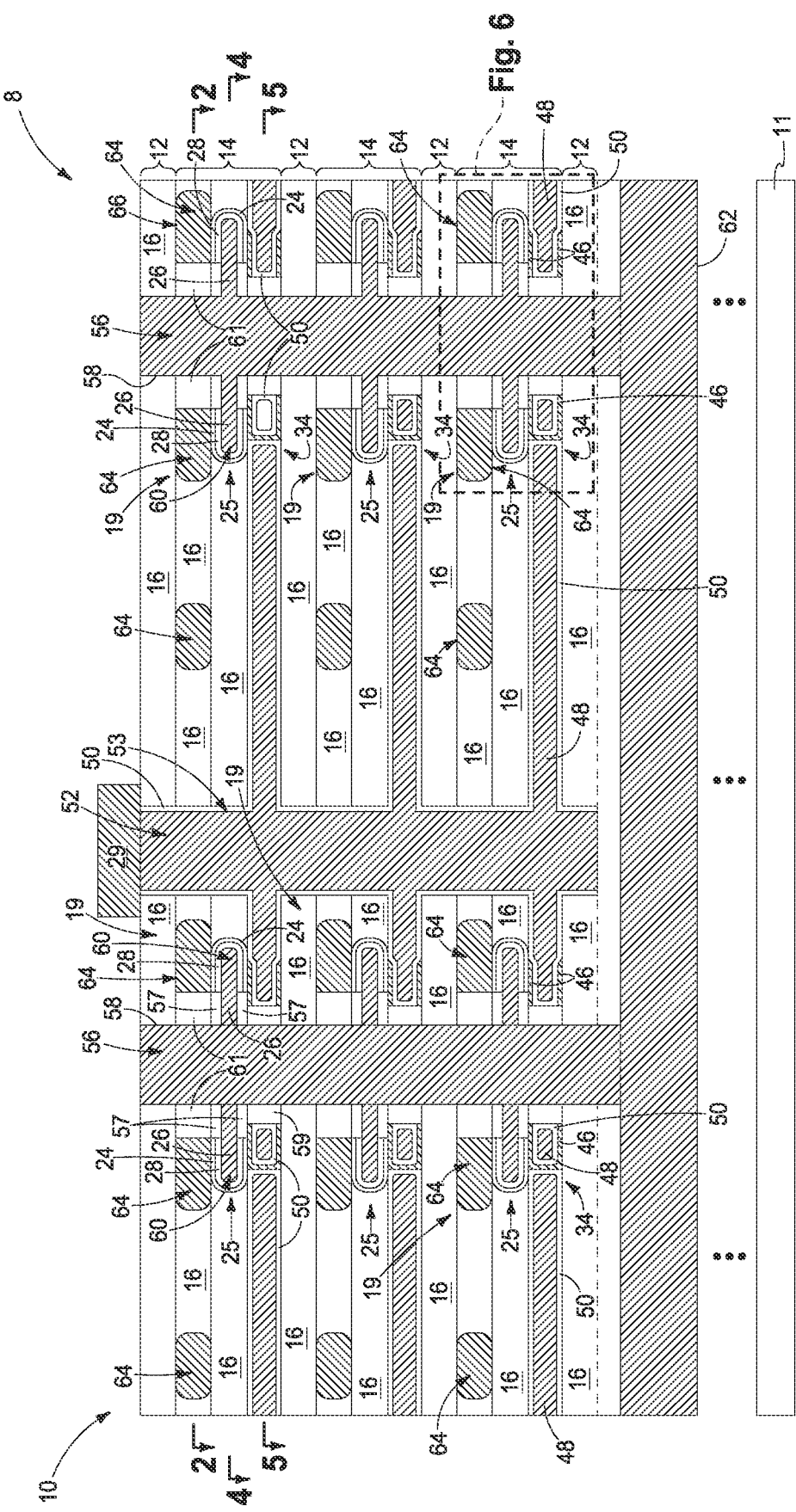
FIG. 1 is a diagrammatic sectional view of a substrate fragment comprising a memory array in accordance with an embodiment of the invention and is taken through line 1-1 in FIGS. 2-5.
Figure 2:
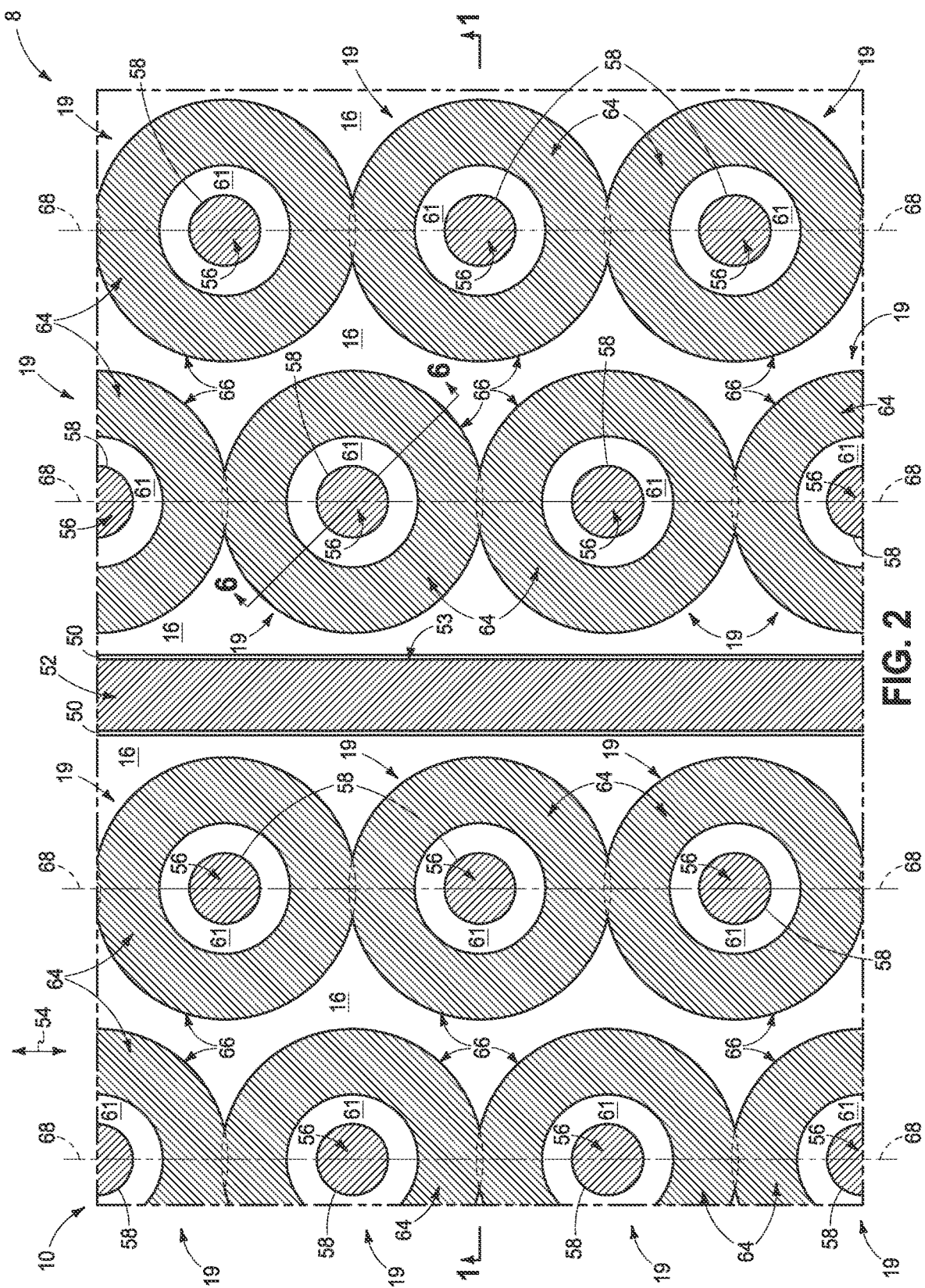
FIG. 2 is a sectional view taken through line 2-2 in FIG. 1.
Figure 3:
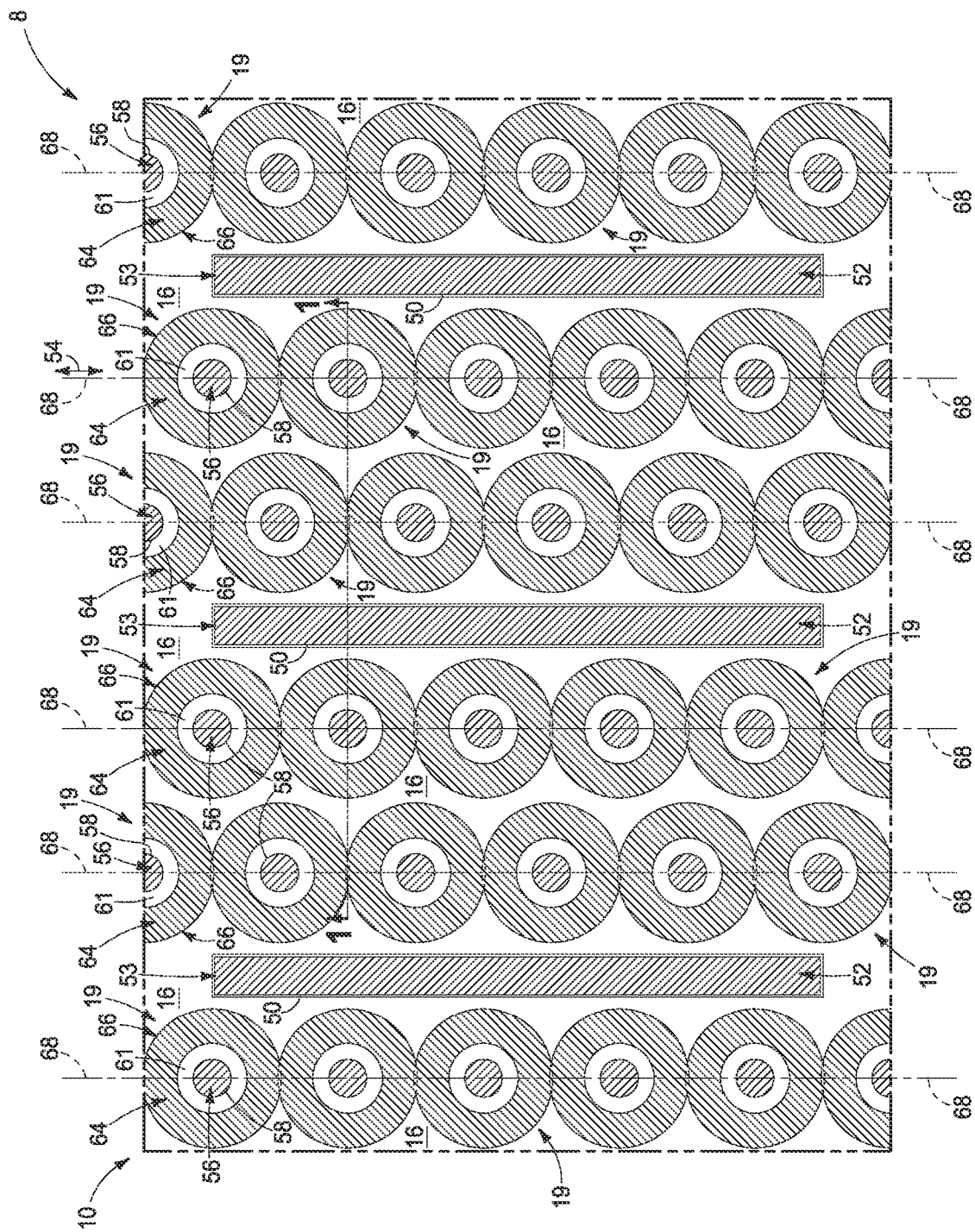
FIG. 3 is a sectional view taken through line 2-2 in FIG. 1, and at a smaller scale than FIGS. 1 and 2.
Figure 4:
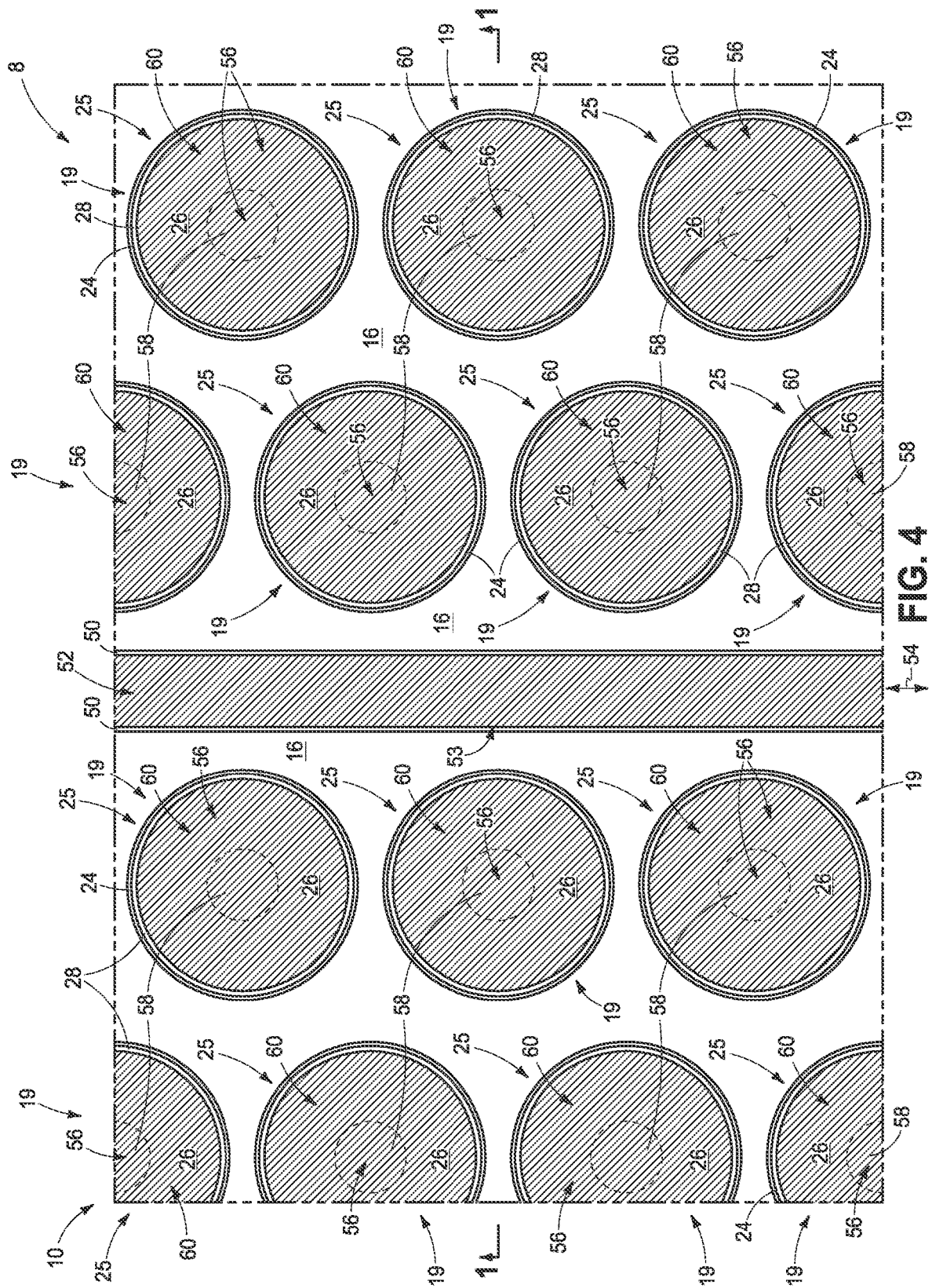
FIG. 4 is a sectional view taken through line 4-4 in FIG. 1.
Figure 5:
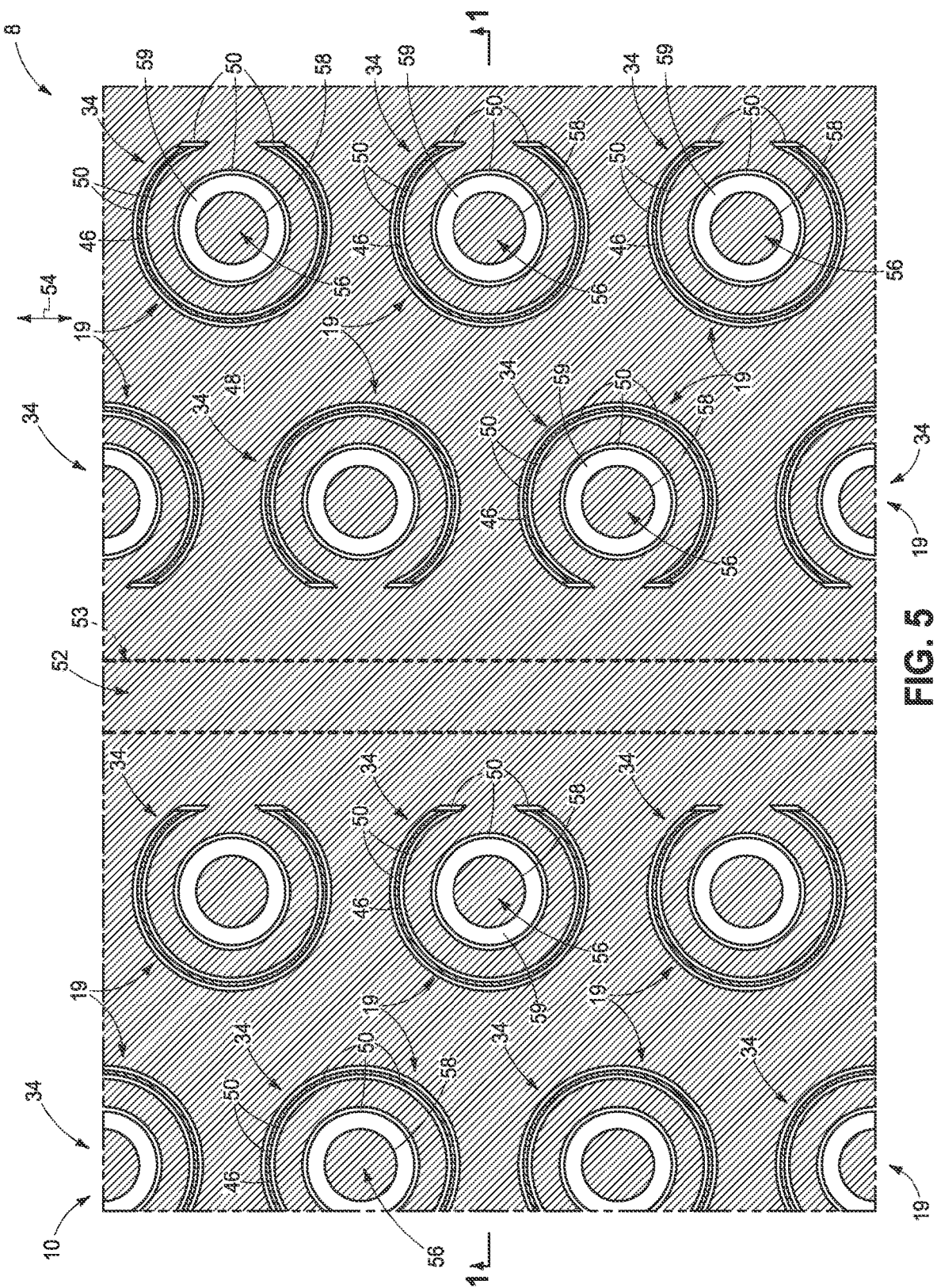
FIG. 5 is a sectional view taken through line 5-5 in FIG. 1.
Figure 6:
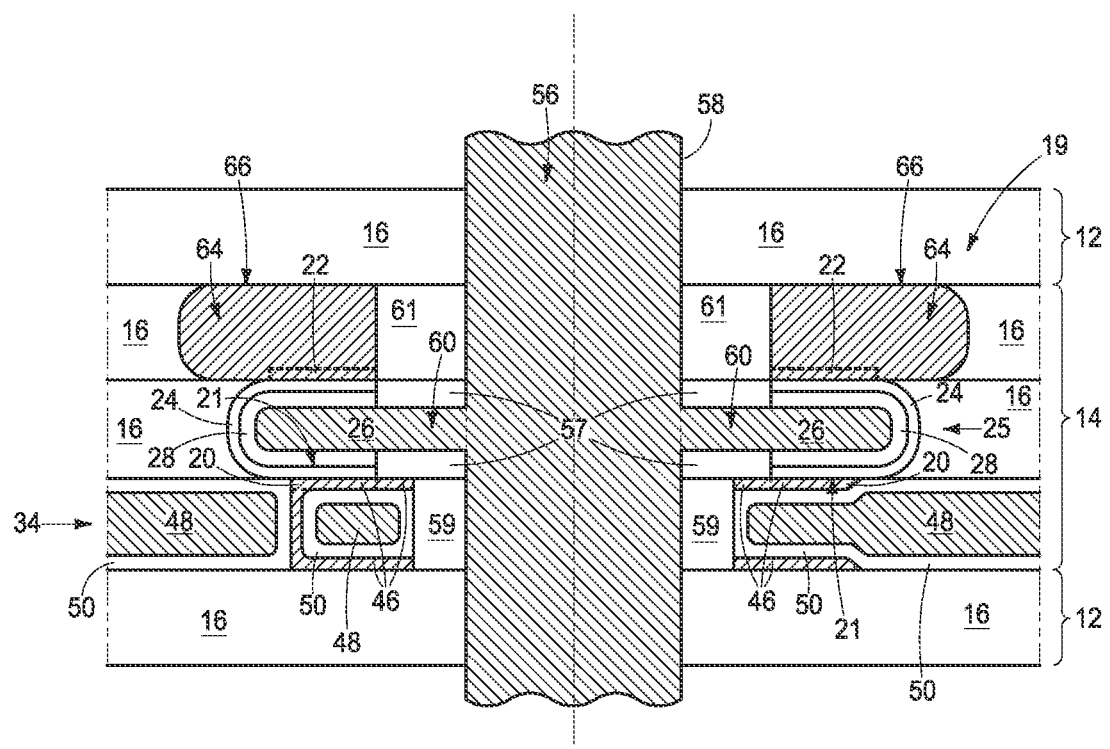
FIG. 6 is an enlarged view of a portion of FIG. 1.

Embodiments of the invention encompass memory arrays. First example embodiments are shown in and described with references to FIGS. 1-7. Such show a construction 8 having a memory array 10 above a base substrate 11 that may comprise any one or more of conductive/conductor/conducting, semiconductive/semiconductor/semiconducting, and insulative/insulator/insulating (i.e., electrically herein) materials. Various materials have been formed elevationally over base substrate 11. Materials may be aside, elevationally inward, or elevationally outward of the FIGS. 1-7-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Construction 8 includes vertically-alternating tiers 12 and 14 of insulative material 16 (e.g., carbon-doped silicon nitride [2 to 10 atomic percent carbon], silicon nitride, and/or doped or undoped silicon dioxide deposited to a thickness of 200 Angstroms to 500 Angstroms) and memory cells 19, respectively. Memory cell tiers 14 may be of the same or different thickness as that of insulative material tiers 12, with different and greater thickness being shown (e.g., 500 Angstroms to 1,500 Angstroms). Construction 8 is shown as having seven vertically-alternating tiers 12 and 14, although likely many more (e.g., dozens, hundreds, etc.) may be formed. Accordingly, more tiers 12 and 14 may be below the depicted tiers and above base substrate 11 and/or more tiers 12 and 14 may be above the depicted tiers.

Memory cells 19 individually comprise a transistor 25 and a capacitor 34. Transistor 25 comprises a first source/drain region 20 (FIGS. 6 and 7) and a second source/drain region 22 having a channel region 24 there-between. Channel region may comprise any suitably doped semiconductor material, such as polysilicon, but not to be intrinsically conductive. Additional examples are GaP and one or more semiconductor oxide(s). As examples, the semiconductor oxide(s) may comprise any suitable composition, and in some embodiments may include one or more of indium, zinc, tin, and gallium. For instance, the semiconductor oxide may have oxygen in combination with any of indium, zinc, and gallium. The indium, zinc, and gallium are metal(s) within such composition (e.g., a semiconductor metal oxide), and alternate and/or additional metal(s) may be used and the composition need not be or comprise one or more stoichiometric compounds. Regardless, and by way of examples only, some examples include $ZnO_x$, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $In_xGa_ySi_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$. Electrically semiconductive regions (e.g., LDD and/or halo regions, and not shown) and/or conductively-doped semiconductive material regions (not shown) may be between channel region 24 and one or both of source/drain regions 20 and 22.

In one embodiment and as shown, one (e.g., 22) of first source/drain region 20 and second source/drain region 22 is above, in one embodiment directly above, the other. In another embodiment, first source/drain region 20 is above, in one embodiment directly above, second source/drain region 22 (e.g., as would occur or appear if the plane-of-the-page upon which each of FIGS. 1, 6, and 7 lies is rotated 180° [turned upside down]). In one embodiment and as shown, channel region 24 comprises opposing C-like shapes 21 (FIGS. 6 and 7) that face one another in a straight-line vertical cross-section, for example the straight-line vertical cross-sections that are the plane-of-the-page upon which each of FIGS. 1 and 6 lies.

A conductive gate 26 is operatively proximate channel region 24. Specifically, in the depicted example, a gate insulator material 28 (e.g., silicon dioxide, silicon nitride, hafnium oxide, other high k insulator material, and/or ferroelectric material) is between gate 26 and channel region 24. In one embodiment, at least a portion of channel region 24 is horizontally-oriented for horizontal current flow in the portion between first source/drain region 20 and second source/drain region 22. In the depicted example embodiment, only a portion of channel region 24 is horizontally-oriented for horizontal current flow there-through. Regardless, when suitable voltage is applied to gate 26, a conductive channel can form within channel region 24 proximate gate insulator material 28 such that current is capable of flowing between source/drain regions 20 and 22.

Capacitor 34 comprises a pair of conductive electrodes, for example a first electrode 46 and a second electrode 48 having a capacitor insulator 50 there-between (e.g., silicon dioxide, silicon nitride, hafnium oxide, other high k insulator material, and/or ferroelectric material). First electrode 46 is electrically coupled, in one embodiment directly electrically coupled, to first source/drain region 20. Individual first source/drain regions 20 may comprise a part of an individual first electrode 46 as shown. In one embodiment and as shown, second capacitor electrodes 48 of multiple of capacitors 34 in array 10 are electrically coupled, in one embodiment directly electrically coupled, to one another. In one embodiment, all such second electrodes of all capacitors in array 10 are electrically coupled with one another, and in one embodiment directly electrically coupled with one another.

In one embodiment, a capacitor-electrode structure 52 (e.g., a solid or hollow pillar, a solid or hollow wall, etc.) extends elevationally through vertically-alternating tiers 12 and 14, with individual of second electrodes 48 of individual capacitors 34 that are in different memory cell tiers 14 being electrically coupled, in one embodiment directly electrically coupled, to elevationally-extending capacitor-electrode structure 52. Example materials for capacitor-electrode structure 52 are metal materials and conductively-doped semiconductor material, and such may be of the same composition as that of second electrodes 48 as shown. In one embodiment, capacitor-electrode structure 52 is directly electrically coupled to a horizontally-elongated capacitor-electrode construction 29 (FIG. 1; e.g., a line or a plate) that is above or below (above being shown) vertically-alternating tiers 12 and 14. Construction(s) 29 may, in one embodiment, directly electrically couple together all second electrodes 48 within the array. In one embodiment and as shown by reduced-scale FIG. 3, multiple capacitor-electrode structures 52 extend elevationally through vertically-alternating tiers 12 and 14, with individual second electrodes 48 of individual capacitors 34 that are in different memory cell tiers 14 being electrically coupled to individual of capacitor-electrode structures 52.

Any other attribute(s) or aspect(s) as shown and/or described herein with respect to other embodiments may be used with respect to the above-described embodiments.

Figure 8:
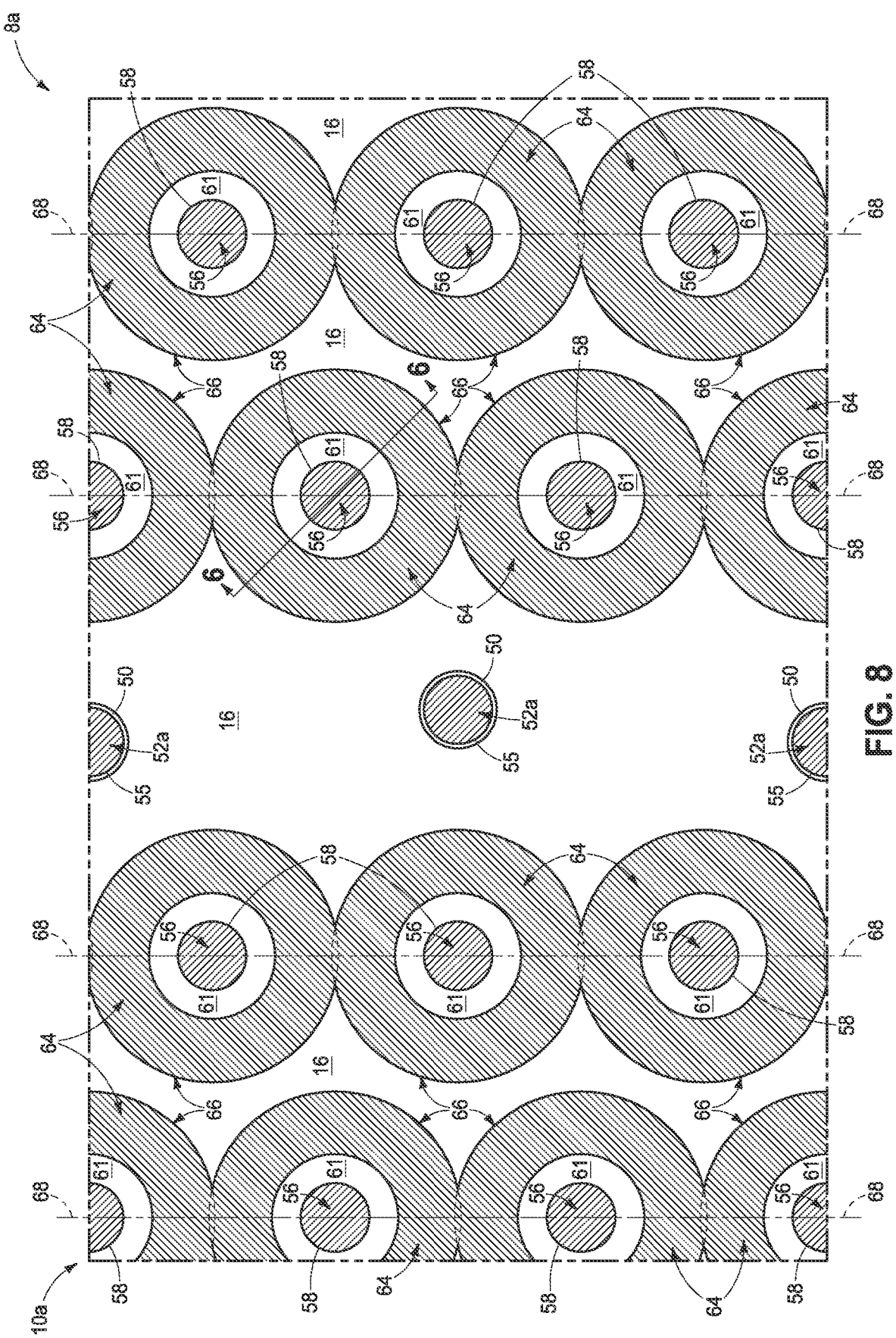
FIG. 8 is a diagrammatic sectional view of an alternate embodiment substrate fragment comprising a memory array in accordance with an embodiment of the invention and as would be taken positionally through a line corresponding to line 2-2 in FIG. 1 with respect to the FIGS. 1-7 embodiments.
Figure 9:
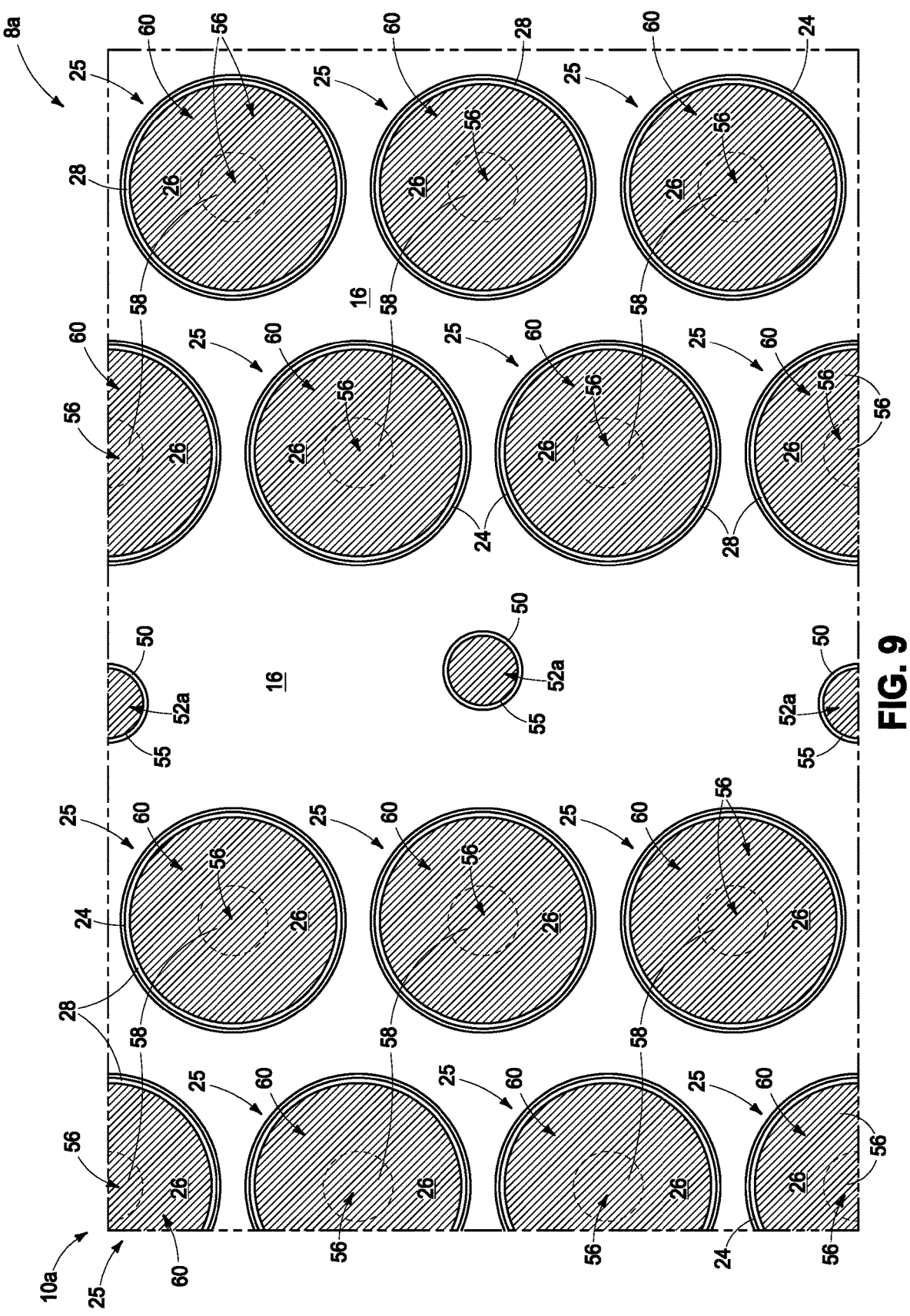
FIG. 9 is a diagrammatic sectional view of the FIG. 8 embodiment as would be taken positionally through a line corresponding to line 4-4 in FIG. 1 with respect to the FIGS. 1-7 embodiments.
Figure 10:
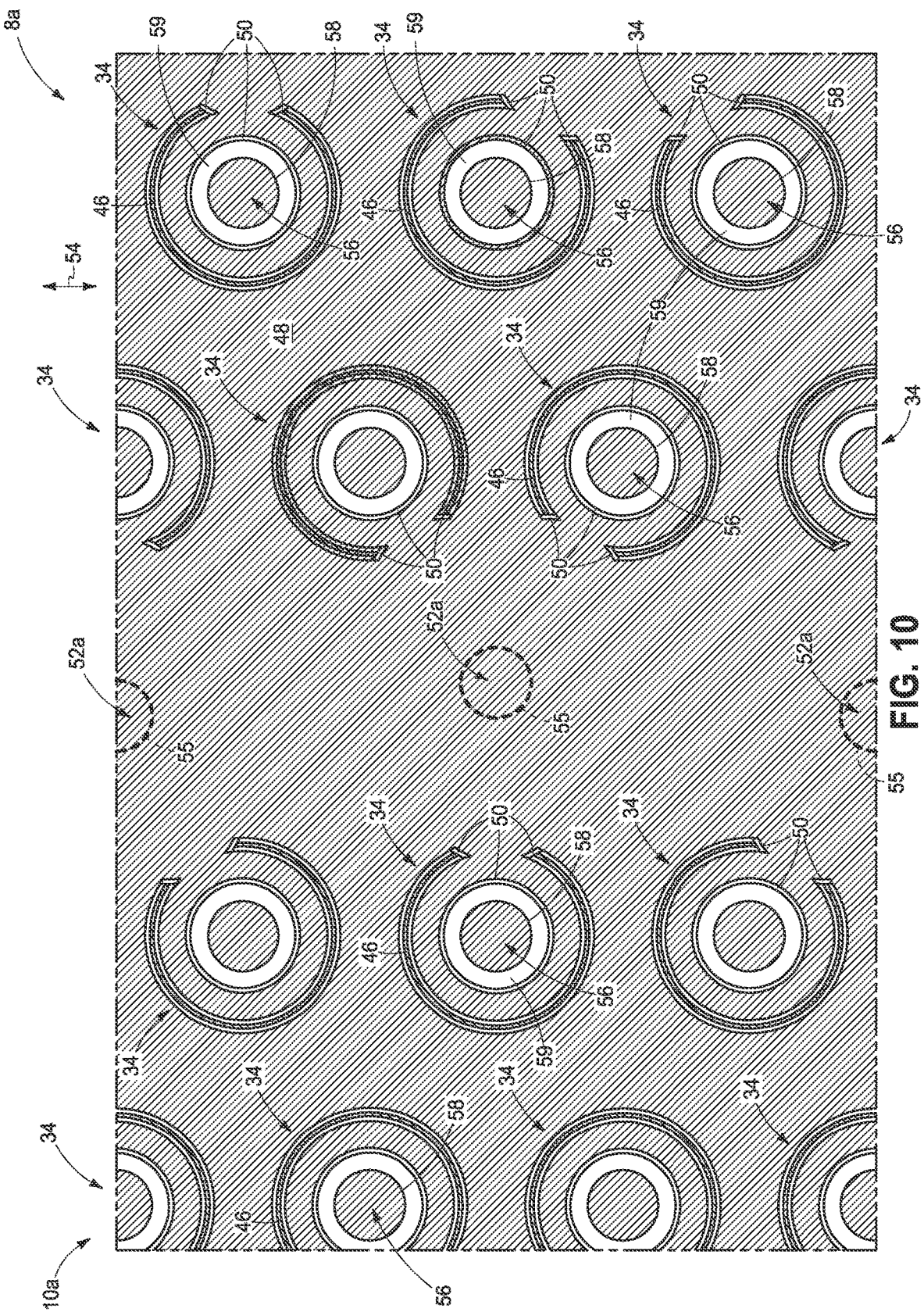
FIG. 10 is a diagrammatic sectional view of the FIG. 8 embodiment as would be taken positionally through a line corresponding to line 5-5 in FIG. 1 with respect to the FIGS. 1-7 embodiments.
Figure 11:
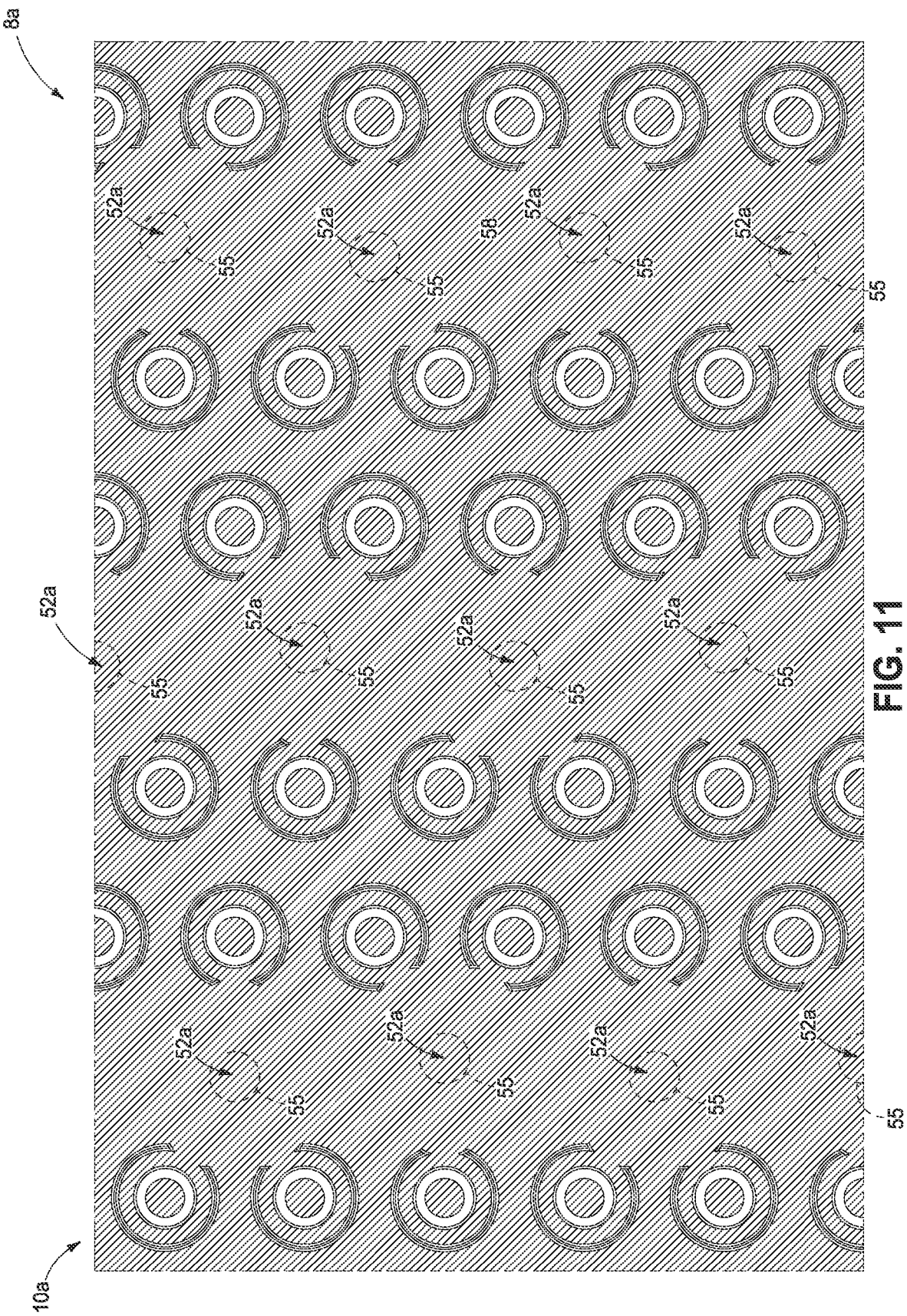
FIG. 11 is a diagrammatic sectional view of the FIG. 10 constructions at a smaller scale than FIG. 10.

In one embodiment and as shown, capacitor-electrode structure 52 comprises an elevationally-extending wall 53 that is longitudinally-elongated horizontally (e.g., along a direction 54 in FIGS. 2-5) and that directly electrically couples the second capacitor electrodes of the multiple capacitors with one another. In one embodiment, such, by way of example only, is one example of how second capacitor electrodes 48 of multiple capacitors 34 that are in different memory cell tiers 14 in array 10 may be electrically coupled to one another. Alternately, and by way of example only, the capacitor-electrode structure may comprise multiple pillars that directly electrically couple the second capacitor electrodes of the multiple capacitors with one another, for example as shown by a construction 8a of an array 10a in FIGS. 8-10. Like numerals from the above-described embodiments have been used where appropriate, with some construction differences being indicated with the suffix "a" or with different numerals. Capacitor-electrode structure 52a comprise multiple pillars 55 that directly electrically couple the second capacitor electrodes of the multiple capacitors with one another. Pillars 55 may electrically couple, in one embodiment directly electrically couple, to horizontally-elongated a capacitor-electrode construction 29 (not shown in FIGS. 8-10) that is above or below vertically-alternating tiers 12 and 14. Any other attribute(s) or aspect(s) as shown and/or described herein with respect to other embodiments may be used.

Wordlines electrically couple together, in one embodiment directly electrically couple together, multiple of the gates of individual of the transistors. Sense-lines are electrically coupled, in one embodiment directly electrically coupled, to multiple of the second source/drain regions of individual of the transistors.

In one embodiment, construction 10 comprises wordline structures 56 that extend elevationally through insulative material 16 and memory cells 19 of vertically-alternating tiers 12 and 14. Individual gates 26 that are in different memory cell tiers 14 are directly electrically coupled to (e.g., comprise a part of) individual wordline structures 56. In one embodiment and as shown, wordline structures 56 individually comprise a pillar portion 58 (e.g., solid or hollow, and not shown in FIG. 7 for clarity of other components) that is vertical or within of 10° of vertical, and in one embodiment gates 26 comprise an annulus 60 radially projecting circumferentially about pillar portion 58. Accordingly, and in some embodiments, gates 26 may be considered as comprising the annulus portion and the annulus portion may be considered as comprising part of the wordline structures. In one embodiment and as shown, individual wordline structures 56 are directly electrically coupled to individual horizontal longitudinally-elongated lines 62 (only one being shown in FIG. 1) that are above or below (below being shown) vertically-alternating tiers 12 and 14.

Example insulating material 57 (e.g., silicon dioxide or silicon nitride) is shown above and below radially-projecting annulus 60 of gates 26. Example insulating material 59 (e.g., silicon dioxide or silicon nitride) is shown between wordline structures 56 and first electrodes 46 of capacitors 34.

In one embodiment, horizontally-extending sense-lines 64 are in individual memory cell tiers 14. Individual second source/drain regions 22 in individual memory cell tiers 14 are electrically coupled, in one embodiment directly electrically coupled, to individual horizontally-extending sense-lines 64 in the respective individual memory cell tier 14. Individual second source/drain regions 22 may comprise a part of an individual sense-line 64 as shown. In one embodiment and as shown, individual horizontally-extending sense-lines 64 comprise end-to-end-overlapping-interconnected ring-like structures 66. Ring-like structures 66 individually circumferentially surround one of wordline structures 56, with example insulating material 61 (e.g., silicon dioxide or silicon nitride) being laterally/radially between sense-lines 64 and wordline structures 56. In one embodiment, sense-lines 64 may be considered as comprising a respective central longitudinal axis 68 which in one embodiment is straight.

The above example structures may be manufactured by any existing or future-developed technique(s). For example, and by way of examples only, insulative material 16 of insulative tiers 12 may comprise carbon-doped silicon nitride. Memory cell tiers 14 may initially be fabricated as a stack that is a layer of undoped silicon nitride above a layer of undoped silicon dioxide above a layer amorphous silicon. Regardless, the components shown if FIGS. 1-11 could be fabricated in any order. In one example, holes would be formed through the entire stack that will correspond to size and shape of pillar portions 58 of the wordline structures. The undoped silicon nitride layer would then be isotropically etched selectively relative to the other exposed materials (e.g., by a timed-wet etch using $H_3PO_4$) to form the outlines of overlapping ring-like portions 66 including the outlines of what will be sense-lines 64. Conductive material of the digitlines would then be deposited within the openings to fill the spaces radially outside of the openings, followed by removing the conductive material centrally from the openings and laterally/radially recessing such conductive material to make room for insulating material 61. Then, insulating material 61 (e.g., undoped silicon nitride) would be deposited within the opening and over the recessed metal, followed by removing such insulating material from being centrally within the vertical openings.

The amorphous silicon layer would then analogously be isotropically wet etched selectively relative to the other materials (e.g., by a timed wet etch using tetramethyl ammonium hydroxide, hereafter TMAH). A thin layer of the conductive material of what will be the first capacitor electrodes 46 would then be deposited, followed by deposition of sacrificial polysilicon. The polysilicon would then be etched back isotropically (e.g., by a timed wet etch using TMAH) to be recessed relative to the vertically-extending openings to mask the remaining radially-outermost portions of the conductive material. This would be followed by removal of such conductive material from sidewalls of the vertical openings and from unmasked portions within the amorphous silicon layers (e.g., by a timed wet etch using a suitable mixture of $NH_4OH$ and $H_2O_2$ if the conductive material is titanium nitride). An insulating material (e.g., silicon nitride) would then be deposited to fill recesses in the amorphous silicon layers and then be removed from the vertical openings.

Then, the silicon dioxide would be isotropically etched selectively relative to other exposed materials (e.g., by a timed wet etch using HF), followed by deposition of a thin layer of channel material 24, then gate insulator 28, and then the conductive material of gates 26. That conductive material would then be removed from the vertical openings (e.g., by etching), then the gate insulator would be selectively wet etched (e.g., using HF if gate insulator 28 is silicon dioxide) to make room for insulating material 57. Then, insulating material 57 would be deposited within the vertical openings and to fill the recesses, followed by removing such insulating material from being centrally within the vertical openings. Conductive material would then be deposited within the vertical openings for use in forming remaining portions of wordline structures 56.

The capacitor-electrode structures 52 could subsequently be formed in analogous manners, for example by starting with forming vertical openings corresponding to outlines of either walls 53 or pillars 55. Subsequent timed isotropic selective etching would then be conducted of the amorphous silicon (e.g., using TMAH) to expose only one side of the conductive material of what will be first capacitor electrodes 46. Then, those exposed portions can be subjected to a short-timed wet etch thereof (e.g., using a suitable mixture of $NH_4OH$ and $H_2O_2$ if the conductive material is titanium nitride) thereby forming isolated first capacitor electrodes 46 (and individual portions of which comprise first source/drain regions 20). This would be followed by deposition of capacitor insulator 50 and conductive material of common second capacitor electrodes 48.

The above described structures may be formed within a vertical recess of a construction whereby the various materials may inherently route upwardly along a sidewall. For example, and by way of example only, FIGS. 12 and 13 show an example such technique whereby a stack of the sense-lines that are in a vertical column in the stack may be routed upwardly for electrically coupling with sense-amplifiers.

Figure 12:
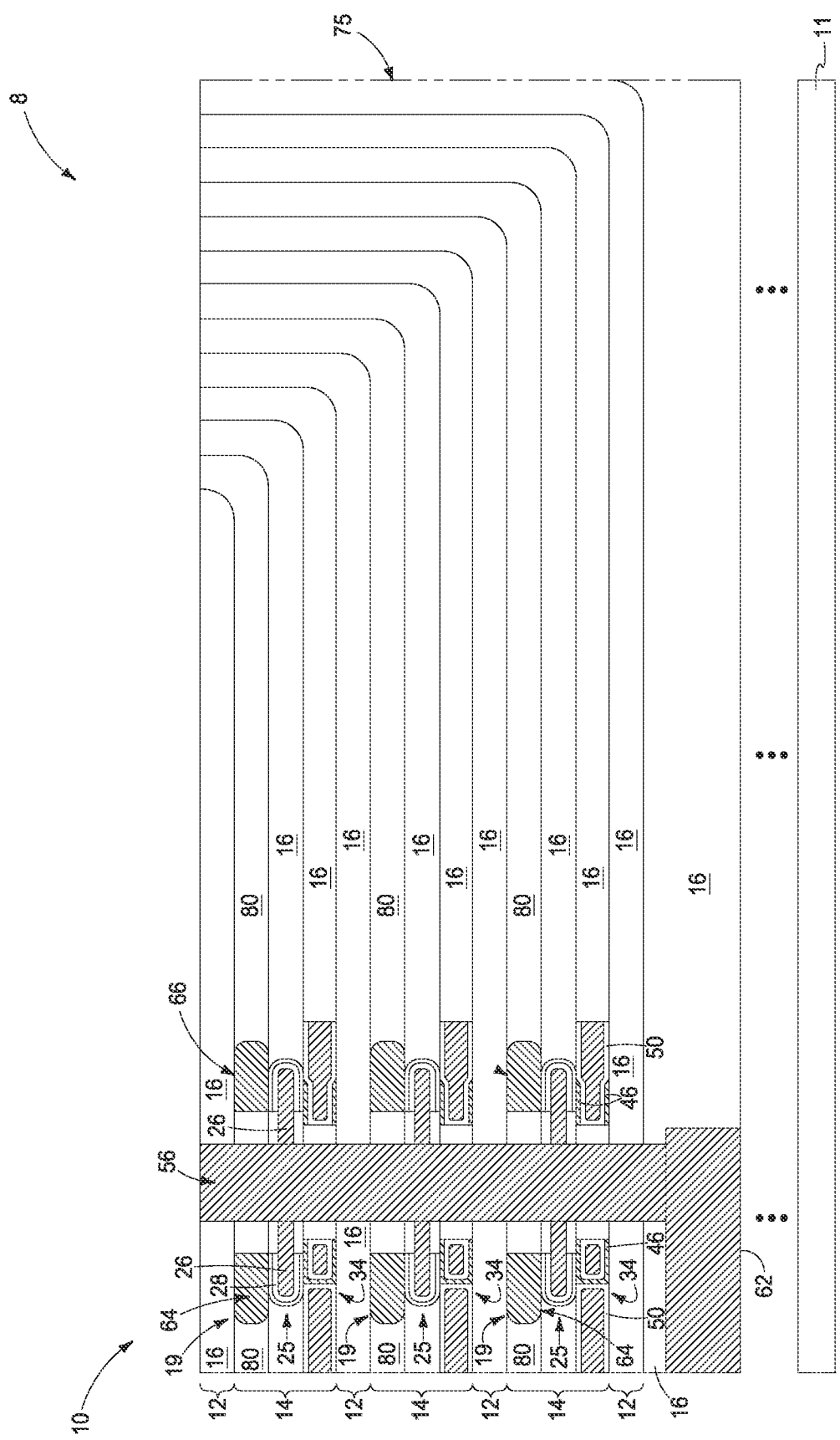
FIG. 12 is a diagrammatic sectional view of another (different) portion of the FIG. 1 substrate fragment.

FIG. 12 shows the various materials of array 10 of construction 8 as having been fabricated within a recess 75 (e.g., bathtub-like) above base substrate 11. What was insulative material 16 (not shown) in the sense-line tiers of memory cell tiers 19 is shown as being insulating material 80 (e.g., undoped silicon nitride) and that would be of an etchably-different composition from that of insulative material 16 (e.g., doped silicon nitride and/or silicon dioxide).

Figure 13:
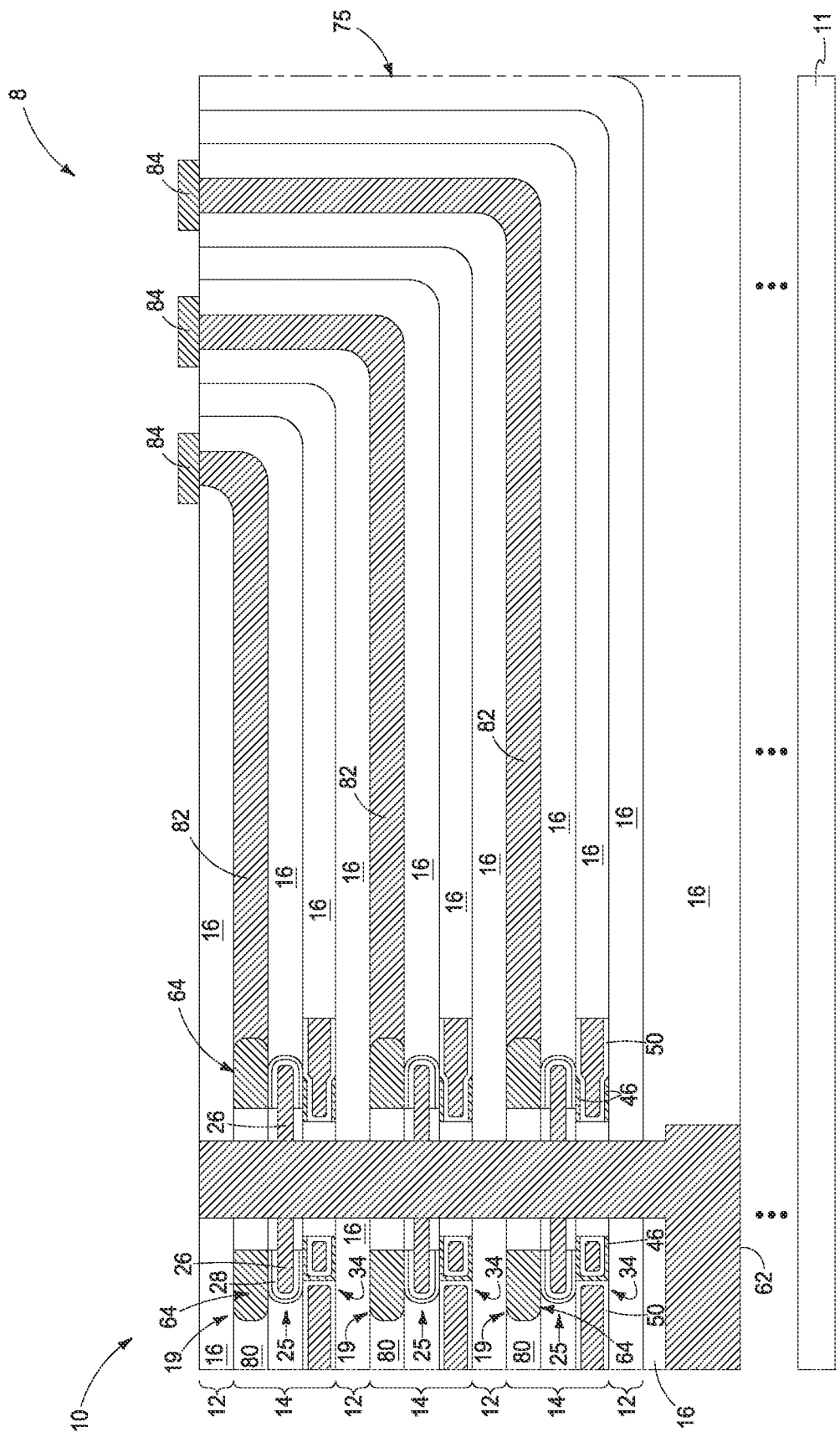
FIG. 13 is a view of the FIG. 12 substrate fragment at a processing step subsequent to that shown by FIG. 12.

FIG. 13 shows insulating material 80 (not shown) as having been removed (e.g., by selective wet etching with $H_3PO_4$) and replaced with conductive material 82 that thereby inherently routes to be accessible above alternating tiers 12 and 14. Such may have been patterned and/or otherwise connected with example conductive lines 84 that may route to sense amplifiers (not shown) or other circuitry (not shown).

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. Wordline structures extend elevationally through the insulative material and the memory cells of the vertically-alternating tiers. Individual of the gates that are in different of the memory cell tiers directly electrically couple to individual of the wordline structures. Sense-lines electrically couple to multiple of the second source/drain regions of individual of the transistors.

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. Horizontally-extending sense-lines are in individual of the memory cell tiers. Individual of the second source/drain regions in the individual memory cell tiers electrically couple to individual of the horizontally-extending sense-lines in the respective individual memory cell tier. Wordlines electrically couple together multiple of the gates of individual of the transistors.

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. Wordline structures extend elevationally through the insulative material and the memory cells of the vertically-alternating tiers. Individual of the gates that are in different of the memory cell tiers directly electrically couple to individual of the wordline structures. Horizontally-extending sense-lines are in individual of the memory cell tiers. Individual of the second source/drain regions in the individual memory cell tiers electrically couple to individual of the horizontally-extending sense-lines in the respective individual memory cell tier.

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. The second capacitor electrodes of multiple of the capacitors in the array electrically couple to one another. Wordline structures extend elevationally through the insulative material and the memory cells of the vertically-alternating tiers. Individual of the gates that are in different of the memory cell tiers directly electrically couple to individual of the wordline structures. A capacitor-electrode structure extends elevationally through the vertically-alternating tiers. Individual of the second electrodes of individual of the capacitors that are in the different memory cell tiers electrically couple to the elevationally-extending capacitor-electrode structure. Sense-lines electrically couple to multiple of the second source/drain regions of individual of the transistors.

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. The second capacitor electrodes of multiple of the capacitors in the array electrically couple to one another. Horizontally-extending sense-lines are in individual of the memory cell tiers. Individual of the second source/drain regions in the individual memory cell tiers electrically couple to individual of the horizontally-extending sense-lines in the respective individual memory cell tier. A capacitor-electrode structure extends elevationally through the vertically-alternating tiers. Individual of the second electrodes of individual of the capacitors that are in different of the memory cell tiers electrically couple to the elevationally-extending capacitor-electrode structure. Wordlines electrically couple together multiple of the gates of individual of the transistors.

In some embodiments, a memory array comprises vertically-alternating tiers of insulative material and memory cells. The memory cells individually comprise a transistor comprising first and second source/drain regions having a channel region there-between and a gate operatively proximate the channel region. The individual memory cells comprise a capacitor comprising first and second electrodes having a capacitor insulator there-between. The first electrode electrically couples to the first source/drain region. The second capacitor electrodes of multiple of the capacitors in the array electrically couple to one another. Horizontally-extending sense-lines are in individual of the memory cell tiers. Individual of the second source/drain regions in the individual memory cell tiers electrically couple to individual of the horizontally-extending sense-lines in the respective individual memory cell tier. A capacitor-electrode structure extends elevationally through the vertically-alternating tiers. Individual of the second electrodes of individual of the capacitors that are in different of the memory cell tiers electrically couple to the elevationally-extending capacitor-electrode structure. Wordlines electrically couple together multiple of the gates of individual of the transistors.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory structure, comprising:
vertically-alternating tiers of insulative levels and memory cell levels, the memory cell levels containing memory cells, individual of the memory cells comprising:
a transistor comprising first and second source/drain regions having a horizontally-oriented channel region there-between and comprising a gate operatively proximate the channel region;
a conductive pillar extending elevationally through multiple of the levels of memory cells, the gate of multiple of the memory cells comprised by the stack being directly electrically coupled to the conductive pillar and extending outwardly from the conductive pillar; and
a conductive line structure extending horizontally within each memory cell level.

2. The memory structure of claim 1 wherein the conductive line structure electrically couples the second source/drain region of a plurality of the transistors.

3. The memory structure of claim 1 wherein,
each of the individual memory cells further comprises a capacitor having first and second capacitor electrodes, the first electrode being directly electrically coupled to the first source/drain region; and
the conductive line structure is directly electrically coupled to the second source/drain regions of the plurality of the transistors.

4. The memory structure of claim 1 wherein each of the individual memory cells further comprises a capacitor having first and second capacitor electrodes, wherein the second capacitor electrode of multiple of the capacitors in the memory structure are electrically coupled to one another.

5. The memory structure of claim 1 wherein the gate comprises an annulus radially projecting circumferentially about the pillar.

6. The memory structure of claim 1 wherein the channel region comprises opposing C-like shapes that face one another in a straight-line vertical cross-section.

7. The memory structure of claim 1 wherein one of the first and second source/drain regions is above the other.

8. A memory structure, comprising:
vertically-alternating tiers of insulative levels and memory cell levels, the memory cell levels containing memory cells, individual of the memory cells comprising:
a transistor comprising first and second source/drain regions having a horizontally-oriented channel region there-between and comprising a gate operatively proximate the channel region;
a conductive pillar extending elevationally through multiple of the levels of memory cells, the gate of multiple of the memory cells comprised by the stack being directly electrically coupled to the conductive pillar;
a conductive line structure extending horizontally within each memory cell level; and
a horizontal longitudinally-elongated line that is above or below the stack and directly electrically coupled to the conductive pillar.

9. A memory structure, comprising:
a plurality of memory cells stacked elevationally over a base, each of the memory cells comprising;
a transistor comprising first and second source/drain regions having a horizontally-oriented channel region there-between and a gate operatively proximate the channel region; and
a capacitor comprising first and second capacitor electrodes having a capacitor insulator there-between, the first electrode being electrically coupled to the first source/drain region;
a conductive structure extending elevationally over the base, all of the gates comprised by the plurality of memory cells being directly electrically coupled to the conductive structure; and
a vertically extending electrode structure that electrically couples second electrodes of multiple memory cells within the memory structure.

10. The memory structure of claim 9 wherein the vertically-extending electrode structure is directly electrically coupled to a horizontally-elongated conductive construction that is above or below the multiple of the memory structures.

11. The memory structure of claim 9, wherein the conductive structure comprises a conductive pillar and wherein all of the gates encircle the conductive pillar.

12. The memory structure of claim 9 wherein the transistor is disposed directly above the capacitor in each of the memory cells.

13. The memory structure of claim 12, wherein each horizontally-extending line structure comprised by the plurality of horizontally-extending line structures is disposed directly above the capacitor of the associated memory cell.

14. A memory array, comprising:
   vertically-alternating tiers of insulative material and memory cells, the memory cells individually comprising:
   a transistor comprising first and second source/drain regions having a channel region there-between and a gate operatively proximate the channel region;
   a capacitor comprising first and second electrodes having a capacitor insulator there-between, the first electrode being electrically coupled to the first source/drain region; and
   horizontally-extending lines in individual of the memory cell tiers, individual of the second source/drain regions in the individual memory cell tiers being electrically coupled to individual of the horizontally-extending lines in the respective individual memory cell tier, the individual horizontally-extending lines comprising end-to-end-overlapping-interconnected ring-like structures.

15. The memory array of claim 14 further comprising conductive line structures electrically coupling together multiple of the gates of individual of the transistors, the conductive line structures comprising pillars, and wherein individual of the gates comprise an annulus around one of the pillars.

16. The memory array of claim 14, wherein the second capacitor electrodes multiple of the capacitors are directly electrically coupled to one another.

* * * * *